United States Patent
Lee et al.

(10) Patent No.: US 11,523,535 B2
(45) Date of Patent: Dec. 6, 2022

(54) SERVER CHASSIS AND FLOW-GUIDING DEVICE THEREOF

(71) Applicant: Wiwynn Corporation, New Taipei (TW)

(72) Inventors: Cyuan Lee, New Taipei (TW); Geng-Ting Liu, New Taipei (TW); Jheng-Ying Jiang, New Taipei (TW); Tai-Shen Yang, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 31 days.

(21) Appl. No.: 17/321,679

(22) Filed: May 17, 2021

(65) Prior Publication Data

US 2022/0248563 A1   Aug. 4, 2022

(30) Foreign Application Priority Data

Feb. 2, 2021   (TW) ................................ 110103897

(51) Int. Cl.
*H05K 7/20*   (2006.01)

(52) U.S. Cl.
CPC ..... *H05K 7/20145* (2013.01); *H05K 7/20154* (2013.01); *H05K 7/20736* (2013.01)

(58) Field of Classification Search
CPC .......... H05K 7/20736; H05K 7/20727; H05K 7/20145; H05K 7/1487; H05K 5/0213; H05K 7/18; H05K 7/20754; H05K 7/20181; H05K 7/20572; H05K 7/20645; H05K 7/20718; H05K 7/20772; G06F 1/20; G06F 1/187; G11B 33/142; G11B 33/08; G11B 33/128

USPC .. 361/679.48, 695, 788, 796, 679.02, 679.2, 361/679.37, 679.46, 679.5, 690, 728; 211/41.12; 312/236; 181/205, 224, 225, 181/292; 360/97.13, 98.01; 454/184

See application file for complete search history.

(56) References Cited

U.S. PATENT DOCUMENTS

| | | | |
|---|---|---|---|
| 11,388,837 B2 * | 7/2022 | Waters | G10K 11/16 |
| 2016/0231791 A1 * | 8/2016 | Peng | G06F 1/20 |
| 2016/0262286 A1 * | 9/2016 | Lin | H05K 7/20145 |
| 2017/0202111 A1 * | 7/2017 | Huang | H05K 7/1487 |
| 2017/0221526 A1 * | 8/2017 | Albrecht | G11B 33/144 |
| 2020/0275584 A1 * | 8/2020 | Chiang | H05K 7/20727 |
| 2020/0363844 A1 * | 11/2020 | Sun | H05K 7/20145 |

FOREIGN PATENT DOCUMENTS

CN   101739089 A   6/2010

OTHER PUBLICATIONS

Examination report dated Oct. 29, 2021, listed in correspondent Taiwan patent application No. 110103897.

* cited by examiner

*Primary Examiner* — Mandeep S Buttar
(74) *Attorney, Agent, or Firm* — McClure, Qualey & Rodack, LLP

(57) ABSTRACT

A server chassis includes a main frame, a fan module, and a flow-guiding device. The fan module and the flow-guiding device are in the main frame. The flow-guiding device includes a plurality of plate bodies. The plate bodies are parallel to each other and are spaced apart from each other by a spacing. Each of the plate bodies has a plurality of openings. The plurality of openings of one of the plate bodies are arranged alternately with those of another plate body adjacent to the one of the plate bodies.

16 Claims, 7 Drawing Sheets

SERVER CHASSIS AND FLOW-GUIDING DEVICE THEREOF

CROSS-REFERENCE TO RELATED APPLICATION

This non-provisional application claims priority under 35 U.S.C. § 119(a) to Patent Application No. 110103897 filed in Taiwan, R.O.C. on Feb. 2, 2021, the entire contents of which are hereby incorporated by reference.

BACKGROUND

Technical Field

The present disclosure relates to a server chassis and a flow-guiding device thereof, and in particular, to a flow-guiding device adapted to guide an airflow in the server chassis.

Related Art

A server generally includes a circuit board and a variety of electronic devices. Heat is often generated during operation of the electronic devices. In order to provide an environment for the electronic devices to operate at an appropriate temperature, a fan is configured in the server chassis to reduce the temperature in the chassis. Rotational speeds of fans of some servers increase with a rising temperature of the chassis. A larger rotational speed of the fan results in a noise and vibration incurred by the airflow. The noise and vibration obviously affect performance of some electronic devices, for example, hard drives of the server.

SUMMARY

In view of the above, according to some embodiments, a server chassis includes a main frame, a fan module, and a flow-guiding device. The fan module and the flow-guiding device are located in the main frame. The flow-guiding device includes a first plate body and a second plate body. The first plate body includes a plurality of first openings. The second plate body includes a plurality of second openings, and the first openings are arranged alternately with the second openings. The first plate body and the second plate body are parallel to each other. The first plate body and the second plate body are spaced apart from each other by a spacing.

In some embodiments, the server chassis further includes a hard disk device located in the main frame, and the flow-guiding device is located between the hard disk device and the fan module.

In some embodiments, the first plate body further includes a plurality of first fins located between the first openings, and the second plate body further includes a plurality of second fins located between the second openings.

In some embodiments, a center of one of the first openings corresponds to a center of one of the second fins, and a center of one of the first fins corresponds to a center of one of the second openings.

In some embodiments, a width of each of the first openings is substantially equal to that of each of the second fins, and a width of each of the second openings is substantially equal to that of each of the first fins.

In some embodiments, the flow-guiding device further includes a border and a sound-absorbing element located on the border.

In some embodiments, the first plate body further includes a first connecting portion, and the second plate body further includes a second connecting portion. The first connecting portion and the second connecting portion connect the first plate body to the second plate body and space the first plate body apart from the second plate body by the spacing.

In some embodiments, a distance d from the flow-guiding device to the fan module satisfies the following formula:
when $f_{Fan} \leq f_{L,i=1}$, $$d = \frac{L}{2};$$

and
when $f_{Fan} > f_{L,i=1}$, $$d = \frac{L}{2[BNL/30C + 0.5]},$$

[ ]: Gauss' notation; where
$f_{Fan}$ is a frequency at which a fan generates a sound wave;
$f_{L,i=1}$ is a fundamental frequency of a standing wave in a direction L;
L is a distance between the fan module and the hard disk device;
B is a number of blades of the fan module;
N is a rotational speed of the fan module; and
C is a speed of the sound wave.

In some embodiments, a density parameter $\alpha$ of the first fins and the second fins satisfy the following formula:
$\alpha = 2p-1 (p=1,2,3,\ldots)$; where p is a positive integer for adjusting the density parameter $\alpha$ of the first fins and the second fins such that $\alpha$ is a positive odd number;
a number J of the first fins and the second fins satisfies the following formula:
$J = j*\alpha$, where j is a number of modalities of the sound wave in a direction W;
a distance a from the center of each of the fins to the center of each of the openings is calculated by using the following formula:

$$a = \frac{W}{2J},$$

where
W is an internal width of the main frame;
a distance b between the fins is calculated by using the following formula:

$$b = \frac{W}{J},$$

and
a width c of each of the fins is calculated by using the following formula:

$$c = \frac{(1-r)W}{J},$$

where r is an opening rate of each of the plate bodies.

In some embodiments, a width e of each of the openings satisfies the following formula:

$$e = a - \frac{c}{2},$$

where a is a distance from the center of each of the fins to the center of each of the openings; and c is a width of each of the fins; and a thickness t of the flow-guiding device satisfies the following formula:

$t \geq (b-c)/2 = rW/2J$, where b is a distance between the fins of the same plate body;

r is an opening rate of each of the plate bodies;

J is a number of the first fins and the second fins; and

W is an internal width of the main frame.

In some embodiments, the spacing between the first plate body and the second plate body is about 0.5 cm to 2 cm.

In some embodiments, a height of the first opening is about 80% to 90% of a height of the first plate body, and a height of the second opening is about 80% to 90% of a height of the second plate body.

According to some embodiments, a flow-guiding device includes a first plate body and a second plate body. The first plate body includes a plurality of first openings. The second plate body includes a plurality of second openings. The first openings are arranged alternately with the second openings. The first plate body and the second plate body are parallel to each other. The first plate body and the second plate body are spaced apart from each other by a spacing.

Based on the above, according to some embodiments, the flow-guiding device may match a server chassis shown in FIG. 1, or may match other server chassis. According to some embodiments, in the server chassis, the flow-guiding device is introduced between the fan module and the hard disk device.

DETAILED DESCRIPTION

Figure 1:
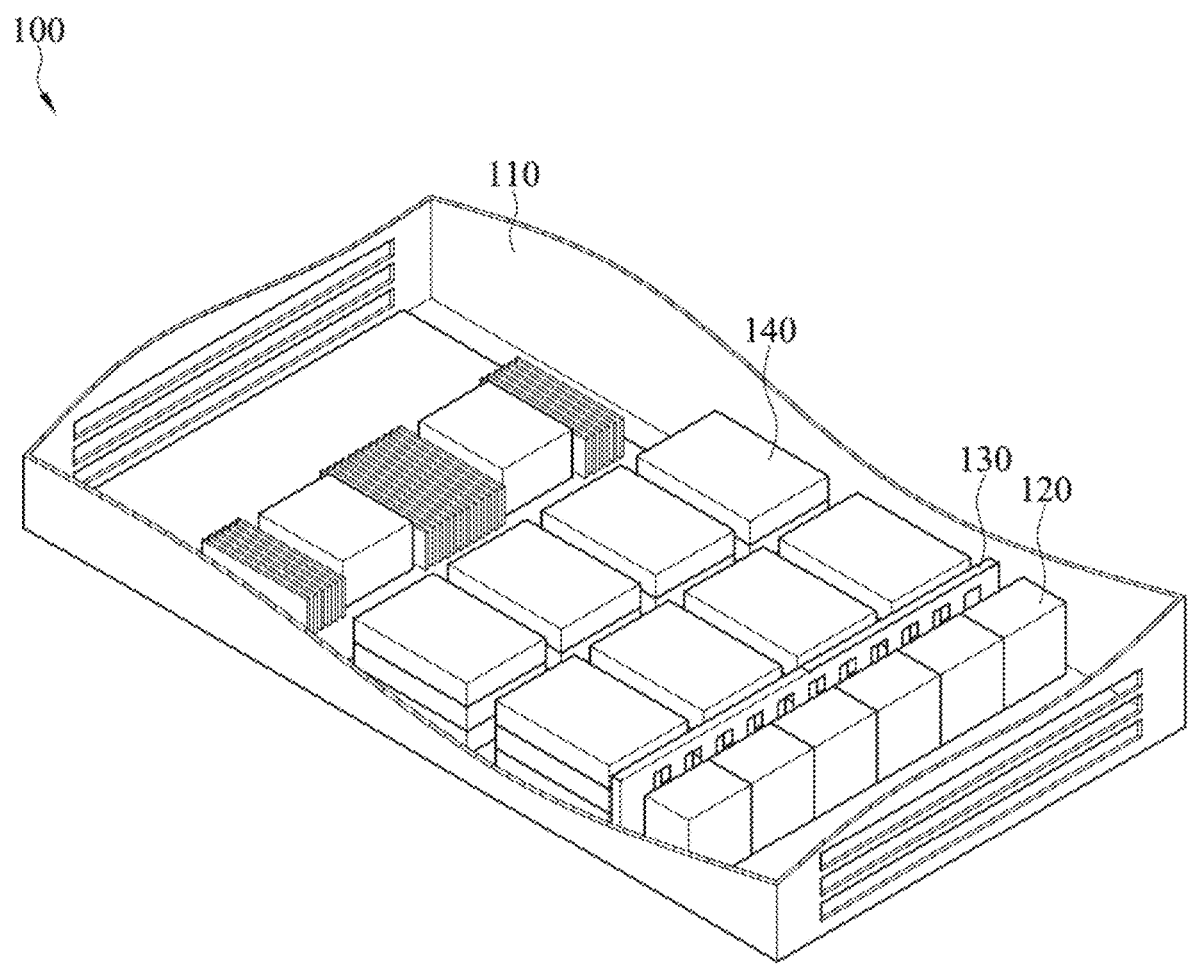
FIG. 1 is a schematic three-dimensional view of a server chassis according to some embodiments.
Figure 2:
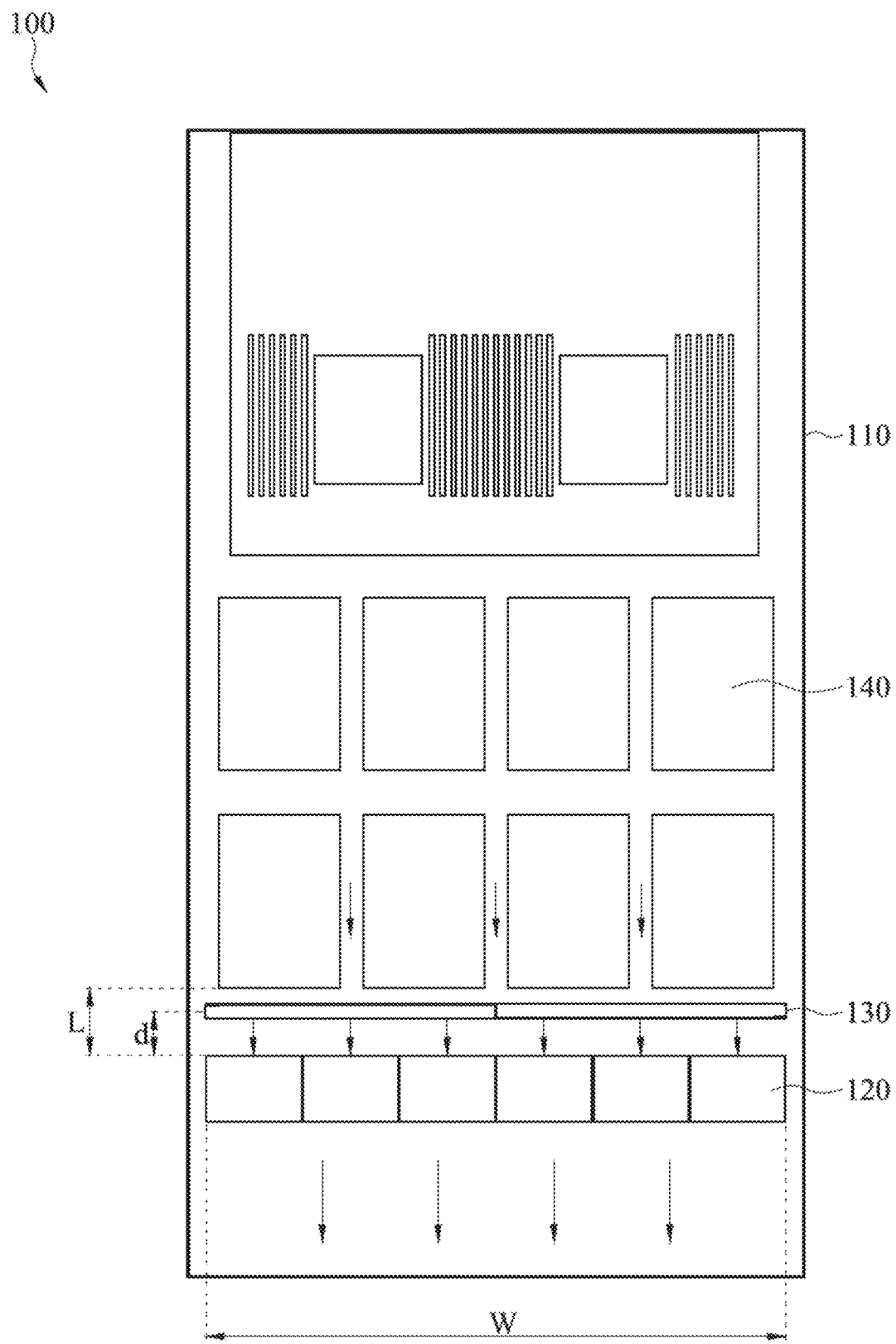
FIG. 2 is a top view of the server chassis according to some embodiments.

Referring to FIG. 1 and FIG. 2, FIG. 1 is a schematic three-dimensional view of a server chassis according to some embodiments, and FIG. 2 is a top view of the server chassis according to some embodiments. A server chassis 100 includes a main frame 110, a fan module 120, and a flow-guiding device 130. In some embodiments, the server chassis 100 further includes a hard disk device 140.

In some embodiments, the server chassis 100 is a rack-mounted server chassis, in which at least one rack-mounted server is accommodated. A height of the rack-mounted server is in a unit of U (1 U equals 1.75 inches and 44.45 millimeters). The server chassis 100 accommodates rack-mounted servers with a specification of, for example but not limited to 1 U to 7 U. In some embodiments, in the server chassis 100, by virtue of guidance of and airflow paths increased by the flow-guiding device 130, energy of a sound wave is attenuated. In this way, the hard disk device 140 suffers from fewer noises generated by an airflow from the fan module 120 and a heat dissipation effect of the server chassis 100 is maintained. In some embodiments, the fan module 120 may draw air or blow air to generate an airflow. In the following description, an induced draft fan module 120 is exemplified, but the present invention is not limited thereto.

In some embodiments, the flow-guiding device 130 is an independent package, and the flow-guiding device 130 may match server chassis of different sizes, for example but not limited to server chassis of different heights such as 1 U, 2 U, and 3 U or server chassis of different widths.

Figure 3:
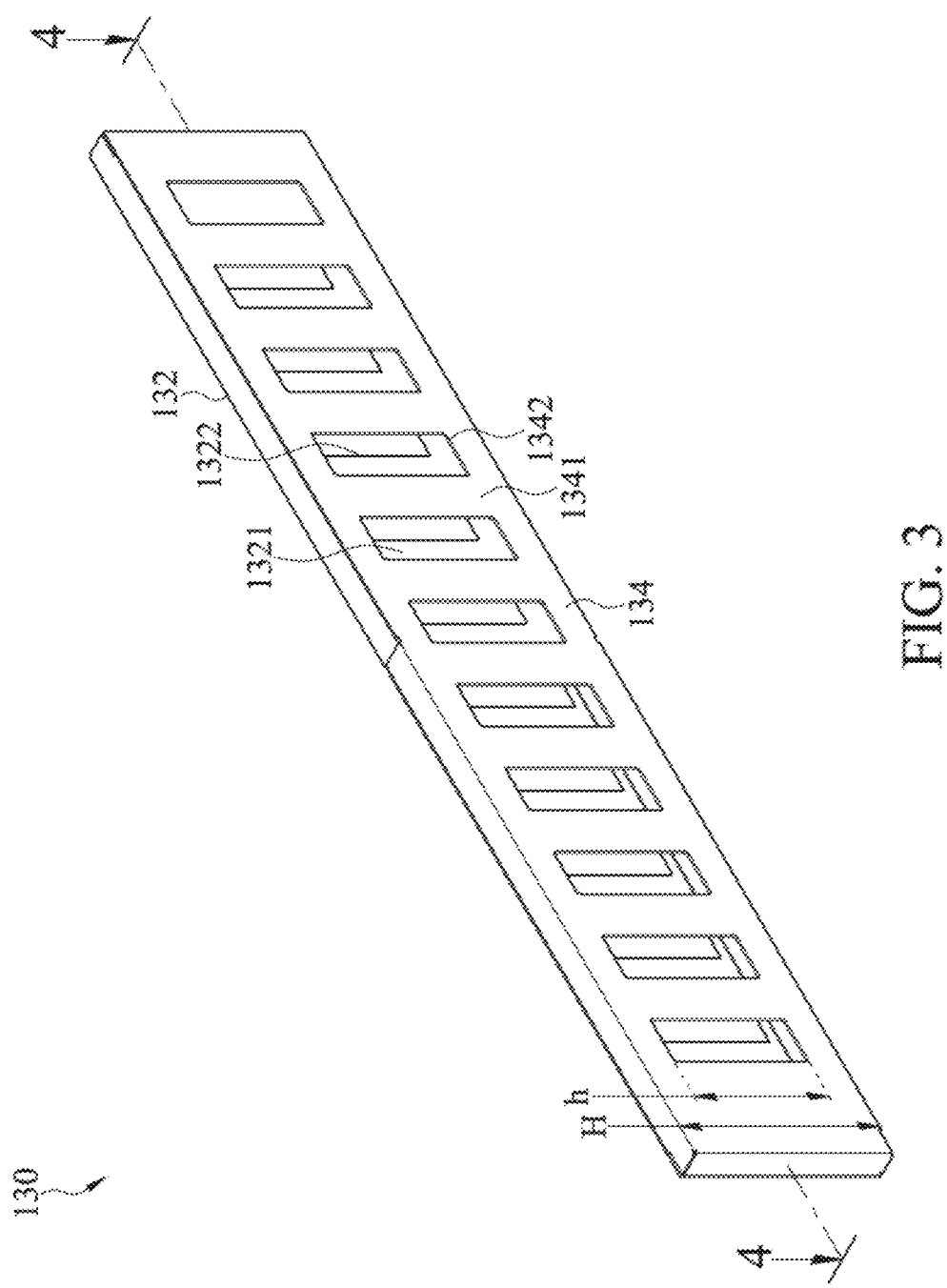
FIG. 3 is a three-dimensional view of a flow-guiding device according to some embodiments.
Figure 4:
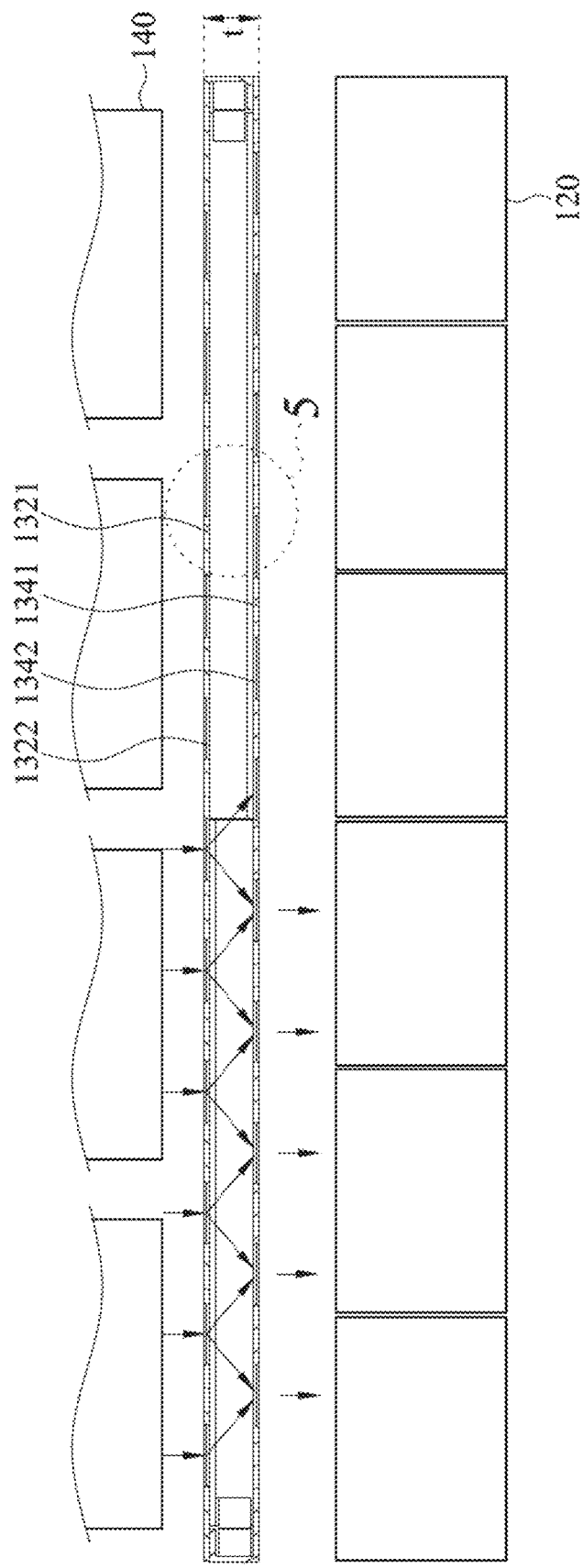
FIG. 4 is a cross-sectional view of a position 4-4 in FIG. 3 according to some embodiments.
Figure 5:
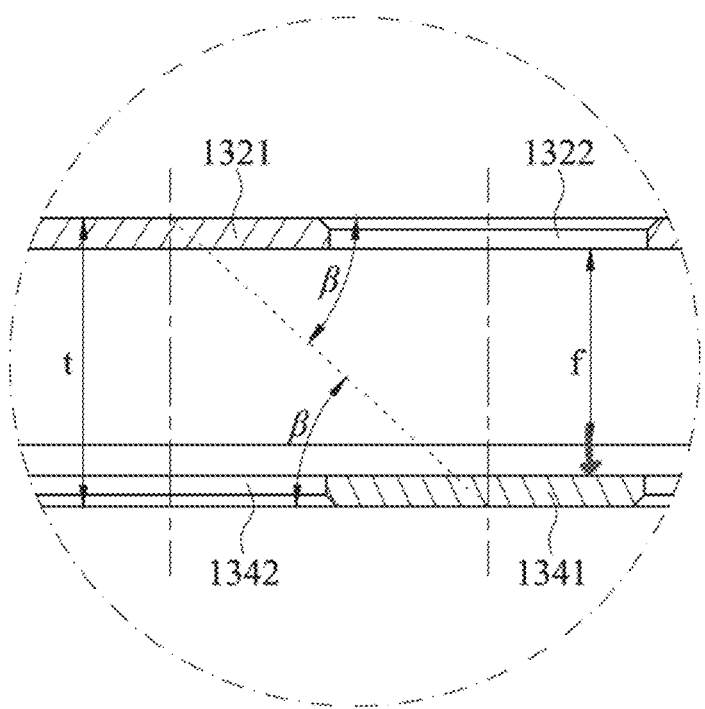
FIG. 5 is an enlarged view of a flow-guiding device in FIG. 4 according to some embodiments.

Referring to FIG. 1, FIG. 3, FIG. 4, and FIG. 5 together, FIG. 3 is a schematic three-dimensional view of a flow-guiding device according to some embodiments, FIG. 4 is a cross-sectional view of a position 4-4 in FIG. 3 according to some embodiments, and FIG. 5 is an enlarged view of a flow-guiding device in FIG. 4 according to some embodiments. As shown in FIG. 1, the fan module 120, the flow-guiding device 130, and the hard disk device 140 are located in the main frame 110, and the flow-guiding device 130 is located between the hard disk device 140 and the fan module 120. In some embodiments, the flow-guiding device 130 may be detachably snapped-fitted or screwed into the main frame 110. In some embodiments, the flow-guiding device 130 is composed of a plurality of plate bodies. Two plate bodies are exemplified herein, but the present invention is not limited thereto. A number of the plate bodies may be adjusted according to a size and a noise reduction effect of the server chassis 100. As shown in FIG. 3, the flow-guiding device 130 includes a first plate body 132 and a second plate body 134. The first plate body 132 includes a plurality of first openings 1322. The second plate body 134 includes a plurality of second openings 1342. As shown in FIG. 4, the first openings 1322 are arranged alternately with the second openings 1342 (described later). The first plate body 132 and the second plate body 134 are parallel to each other and are spaced apart from each other by a spacing f. The hard disk device 140 is located in the main frame 110. As shown in FIG. 4, in some embodiments, the fan module 120 is adapted to generate an airflow and draw out hot air generated by the hard disk device 140. The airflow is caused to pass through the first openings 1322 of the first plate body 132 and the second openings 1342 of the second plate body 134. Since the first openings 1322 are arranged alternately with the second openings 1342, a flow guiding effect is generated.

Referring to FIG. 4 again, specifically, when the airflow passes through the first plate body 132, the airflow is guided to the first openings 1322, and the sound waves generated by the airflow are caused to interfere with each other. Then through the second plate body 134 placed at a position where the sound waves interfere with each other, the airflow is guided to the second openings 1342 arranged alternately with the first openings 1322, and energy generated by the sound waves is reduced again, thereby reducing influence of the sound waves on the hard disk device and maintaining the heat dissipation effect. Specifically, interference between the sound waves caused by the flow-guiding device 130 is based on a standing wave principle. Two sine waves with the same wavelength, cycle, frequency, and wave velocity proceed in opposite directions to interfere with each other and form a composite wave, which is referred to as a standing wave. When passing through the first openings 1322, airflows generate sound wave interference with each other for the first time. When passing through the second openings 1342, the airflows generate sound wave interference, which further reduces energy generated by the sound waves. In some embodiments, since the first openings 1322 are arranged alternately with the second openings 1342, after the airflows enter the first openings 1322, the airflows are turned to the second openings 1342 at about 45 degrees. In some embodiments, since the space inside the rack-mounted server is limited, in order to prevent the heat dissipation effect from being affected as a result of excessive space occupation by the flow-guiding device 130 in the main frame 110, the spacing f between the first plate body 132 and the second plate body 134 is 0.5 cm to 2 cm, which not only provides a sufficient space for the airflow to flow, but also reduce the effect of sound waves. Preferably, the spacing f is 2 cm.

In some embodiments, the first plate body 132 further includes a plurality of first fins 1321, and the first fins 1321 are located between the first openings 1322. The second plate body 134 further includes a plurality of second fins 1341, and the second fins 1341 are located between the second openings 1342. In some embodiments, when the airflow passes through the first plate body 132, the airflow is guided to the first openings 1322 by the first fins 1321. When the airflow enters the first openings 1322, the airflow is turned to the second openings 1342 due to the second fins 1341.

The alternate arrangement between the first openings 1322 and the second openings 1342 have a plurality of implementations. As shown in FIG. 5, in some embodiments, a center of one of the first openings 1322 corresponds to a center of one of the second fins 1341, and a center of one of the first fins 1321 corresponds to a center of one of the second openings 1342. In some embodiments, a center line of one of the first openings 1322 corresponds to a center line of one of the second fins 1341, and a center line of one of the first fins 1321 corresponds to a center line of one of the second openings 1342. An angle β between the center line of the first opening 1322 and the center line of the second opening 1342 is approximately 30 degrees to 60 degrees, and preferably, 45 degrees. Through the configuration, when the airflow passes through the first openings 1322, the sound waves interfere with each other, and the airflow is turned to the second openings 1342 under blocking by the second fins 1341. When the airflow passes through the second openings 1342, the sound waves interfere with each other again to reduce the energy of the sound waves. A corresponding allowable tolerance range is 0.5 mm to 4 mm herein.

As shown in FIG. 4, in some embodiments, a width of each of the first openings 1322 is substantially equal to that of each of the second fins 1341, and a width of each of the second openings 1342 is substantially equal to that of each of the first fins 1321. The expression "substantially" herein means that the length may have a tolerance/margin range. In some embodiments, through the configuration in which the width of each of the first openings 1322 is substantially equal to that of each of the second fins 1341 and the width of each of the second openings 1342 is substantially equal to that of each of the first fins 1321, when passing through the first openings 1322, the airflow is turned to the second openings 1342 under blocking by the second fins 1341. However, the above is merely an example, and actually, the present invention is not limited thereto. In some embodiments, the effects of reducing the energy of the sound waves and heat dissipation may also be achieved through a configuration in which the width of each of the first openings 1322 is less than that of each of the second fins 1341 and the width of each of the second openings 1342 is less than that of each of the first fins 1321. As the openings decrease in size, the interference between the sound waves enhances, but the airflow is limited by the decreased openings, resulting in a reduced heat dissipation effect. In some embodiments, the effects of reducing the energy of the sound waves and heat dissipation may also be achieved through a configuration in which the width of each of the first openings 1322 is greater than that of each of the second fins 1341 and the width of each of the second openings 1342 is less than that of each of the first fins 1321. As the openings increase is size, the heat dissipation is accordingly enhanced, but the openings with the increased size also result in reduced interference between the sound waves.

Referring to FIG. 3 again, in some embodiments, a height h of the first opening 1322 is about 80% to 90% of a height H of the first plate body 132, and a height h of the second opening 1342 is about 80% to 90% of a height H of the second plate body 134. In some embodiments, as the height of the opening increases, a space for the airflow to pass through also increases. For example, the height of the openings may be set to be close to an edge of the plate body, so that the opening is roughly aligned with the edge of the plate body, thereby improving the heat dissipation effect.

Figure 6:
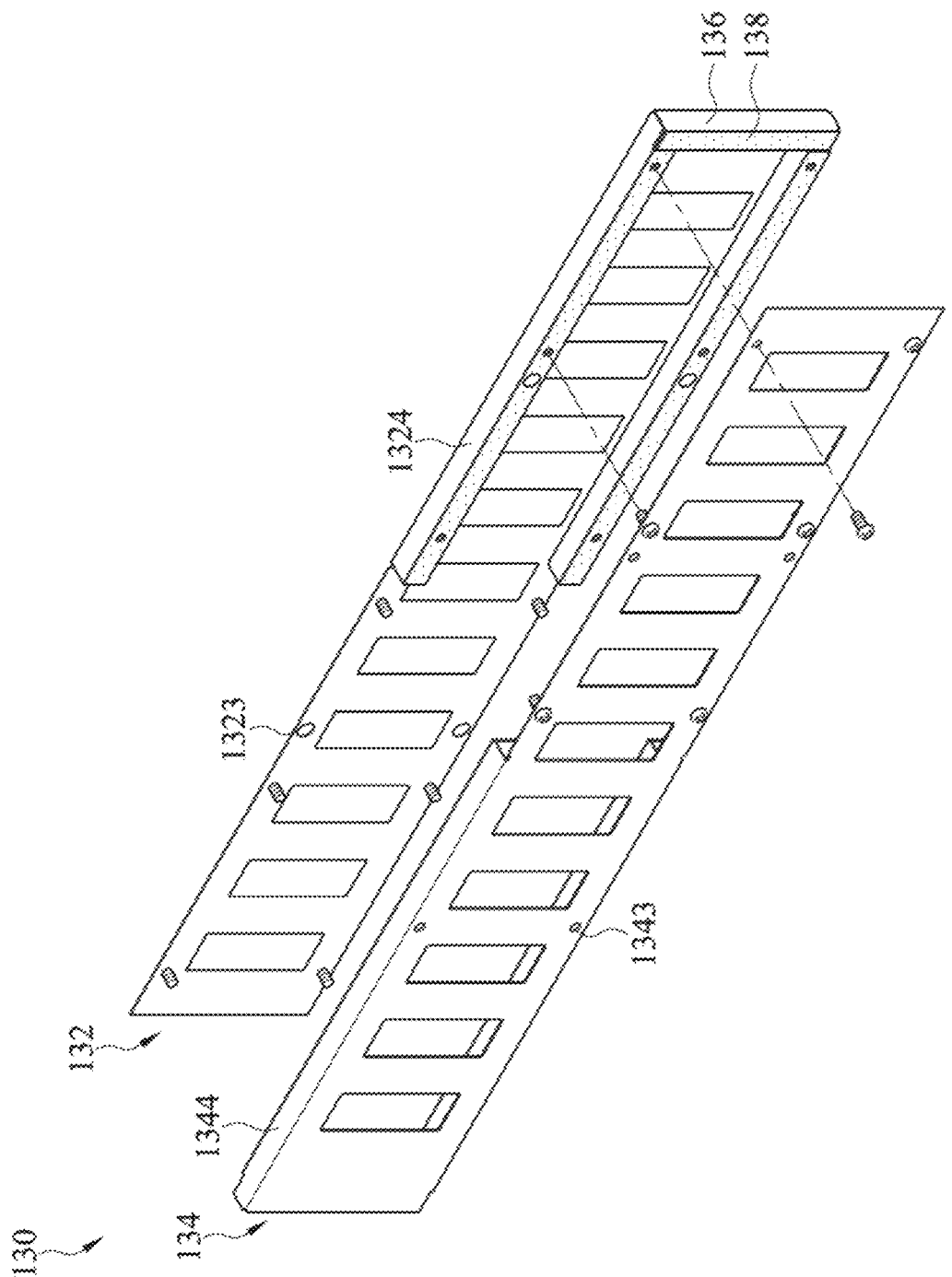
FIG. 6 is an exploded view of the flow-guiding device according to some embodiments.

Referring to FIG. 6, FIG. 6 is an exploded view of the flow-guiding device according to some embodiments. In some embodiments, the flow-guiding device 130 further includes a border 136 and a sound-absorbing element 138. The sound-absorbing element 138 is located on the border 136. In some embodiments, the border 136 is an outer surface, an inner surface, or the outer surface and the inner surface of the flow-guiding device 130. For example, the border is the inner surface herein, but the present invention is not limited thereto. The sound-absorbing element 138 surrounds and is attached to the border 136. The sound-absorbing element 138 may be, for example, rubber or a foam board, but the present invention is not limited thereto.

As shown in FIG. 6, in some embodiments, the first plate body 132 further includes a first hole 1323, and the second plate body 134 further includes a second hole 1343. The first hole 1323 corresponds to the second hole 1343. In some embodiments, the first hole 1323 is larger than the second hole 1343, and the first hole 1323 and the second hole 1343 are configured to assist assembling of the first plate body 132 and the second plate body 134.

As shown in FIG. 6, in some embodiments, the first plate body 132 further includes a first connecting portion 1324, and the second plate body 134 further includes a second connecting portion 1344. The first plate body 132 and the second plate body 134 are connected to each other and are spaced apart from each other by a spacing f through the first connecting portion 1324 and the second connecting portion 1344. In some embodiments, the first connecting portion 1324 is connected to the second plate body 134 through, for example, but not limited to, locking, welding, or riveting, and the second connecting portion 1344 is connected to the first plate body 132 through, for example, but not limited to, locking, welding, or riveting.

Referring to FIG. 2 again, in some embodiments, the flow-guiding device 130 is adapted to match the server chassis 100 in size, and a relatively good size configuration of the flow-guiding device 130 may be obtained by using a calculation formula. In some embodiments, a distance d between the flow-guiding device 130 and the fan module 120 is calculated based on a distance L between the fan module 120 and the hard disk device 140, a number B of blades of the fan module 120, a rotational speed N of the fan module 120, a number C of sound waves, and comparison between a frequency $f_{Fan}$ at which the fan generates the sound wave and a fundamental frequency $f_{L,i=1}$ of a standing wave in a direction L. The formula is as follows:

when $f_{fan} \leq f_{L,i=1}$, $$d = \frac{L}{2};$$

and
when $f_{Fan} = f_{L,i=1}$, $$d = \frac{L}{2[BNL/30C + 0.5]},$$

[ ]: Gauss' notation

In some embodiments, a density parameter α of the first fins 1321 and the second fins 1341 is calculated based on consistency between odd-numbered frequency antinodes of a standing wave. The frequency antinodes of the standing wave are positions where the sound waves oscillate greatly. p is a positive integer for adjusting the density parameter α of the first fins and the second fins such that α is a positive odd number, and the density parameter α respectively means a density parameter of the first fins 1321 of the first plate body 132 and a density parameter of the second fins 1341 of the second plate body 134. The formula is as follows:

$$\alpha = 2p-1 (p=1,2,3,\ldots).$$

In some embodiments, a number J of the first fins 1321 and a number J of the second fins 1341 are respectively calculated by using a number j of modalities in a direction W of the sound wave and the density parameter α. The number J of the first fins 1321 and the second fins 1341 respectively means a number of the first fins 1321 of the first plate body 132 and a number of the second fins 1341 of the second plate body 134. The formula is as follows:

$$J = j*\alpha$$

Figure 7:
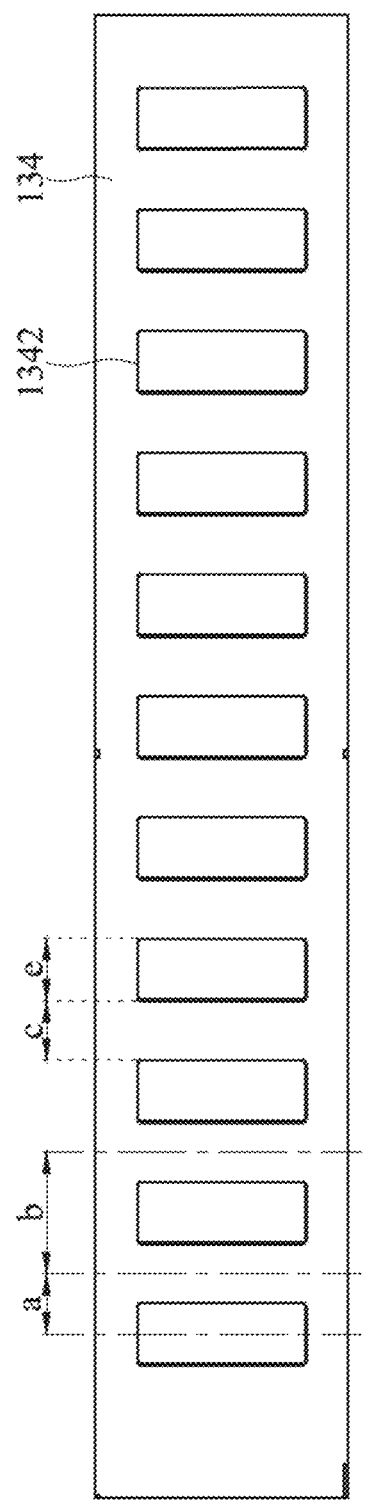
FIG. 7 is a front view of the flow-guiding device according to some embodiments.

Referring to FIG. 2 and FIG. 7 together, FIG. 7 is a front view of a flow-guiding device according to some embodiments. In some embodiments, a distance a from a center of each of the fins to a center of each of the openings of the same plate body is calculated through an internal width W of the main frame 110 and the number J of the first fins 1321 and the second fins 1341. The formula is as follows:

$$a = \frac{W}{2J}.$$

As shown in FIG. 2 and FIG. 7, in some embodiments, a distance between the fins of the same plate body is calculated through the internal width W of the main frame 110 and the number J of the first fins 1321 and the second fins 1341. The formula is as follows:

$$b = \frac{W}{J}.$$

As shown in FIG. 2 and FIG. 7, in some embodiments, a width c of each of the fins of the same plate body is calculated through the internal width W of the main frame 110, the number J of the first fins 1321 and the second fins 1341, and an opening rater of each of the plate bodies. The formula is as follows:

$$c = \frac{(1-r)W}{J}$$

As shown in FIG. 7, in some embodiments, a width e of each of the openings is calculated through the distance a from the center of each of the fins to the center of each of the openings and the width c of each of the fins. The formula is as follows:

$$e = a - \frac{c}{2}$$

As shown in FIG. 4, in some embodiments, a thickness t of the flow-guiding device 130 is calculated through the distance b between the fins of the same plate body, the width c of each of the fins, the number J of the first fins 1321 and the second fins 1341, the opening rate r of each of the plate bodies, and the internal width W of the main frame 110. The formula is as follows:

$$t \geq (b-c)/2 = rW/2J.$$

Based on the above, in the server chassis 100 according to an embodiment of the present invention, the fan module 120 located in the main frame 110 is adapted to generate the airflow and draw out hot air generated during the operation of the hard disk device 140 via the flow-guiding device 130 between the fan module 120 and the hard disk device 140. The flow-guiding device 130 includes the first plate body 132 and the second plate body 134. When the airflow passes through the first plate body 132, the airflow is guided to the first openings 1322, and the sound waves interfere with each other. Then through the second plate body 134 placed at the position where the sound waves interfere with each other, the airflow is guided to the second openings 1342 arranged alternately with the first openings 1322, and the energy generated by the sound waves is reduced again, thereby reducing the influence of the sound waves on the hard disk device 140 and maintaining the heat dissipation effect. As shown in Table 1, by comparing the server chassis 100 with the flow-guiding device 130 and a server chassis without the flow-guiding device 130, it can be observed that the server chassis 100 with the flow-guiding device 130 can effectively reduce the influence of sound waves on the hard disk device 140 under high-speed rotation of the fan module 120, thereby improving operating efficiency of the hard disk device 140.

TABLE 1

| Duty cycle of the fan module | 80% | 90% | 100% |
|---|---|---|---|
| Operating efficiency of the server chassis without the flow-guiding device | 83.13% | 28.14% | 44.18% |
| Operating efficiency of the server chassis with the flow-guiding device | 97.15% | 90.55% | 90.55% |

What is claimed is:

1. A server chassis, comprising:
   a main frame;
   a fan module located in the main frame; and
   a flow-guiding device located in the main frame, wherein the flow-guiding device comprises:
   a first plate body comprising a plurality of first openings; and
   a second plate body, wherein the first plate body and the second plate body are parallel to each other and are spaced apart from each other by a spacing, the second plate body comprises a plurality of second openings, and the first openings are arranged alternately with the second openings;
   wherein the first plate body further comprises a plurality of first fins located between the first openings, and the second plate body further comprises a plurality of second fins located between the second openings;
   wherein a width of each of the first openings is substantially equal to that of each of the second fins, and a width of each of the second openings is substantially equal to that of each of the first fins.

2. The server chassis according to claim 1, further comprising a hard disk device located in the main frame, wherein the flow-guiding device is located between the hard disk device and the fan module.

3. The server chassis according to claim 1, wherein a center of one of the first openings corresponds to a center of one of the second fins, and a center of one of the first fins corresponds to a center of one of the second openings.

4. The server chassis according to claim 1, wherein the flow-guiding device further comprises a border and a sound-absorbing element located on the border.

5. The server chassis according to claim 1, wherein the first plate body further comprises a first connecting portion, the second plate body further comprises a second connecting portion, the first connecting portion and the second connecting portion connect the first plate body to the second plate body and space the first plate body apart from the second plate body by the spacing.

6. The server chassis according to claim 2, wherein a distance d from the flow-guiding device to the fan module satisfies the following formula:

when $f_{Fan} \leq f_{L,i=1}$, $$d = \frac{L}{2};$$

and
when $f_{Fan} > f_{L,i=1}$, $$d = \frac{L}{2[BNL/30C + 0.5]},$$

[ ]: Gauss' notation; wherein
$f_{Fan}$ is a frequency at which a fan module generates a sound wave;
$f_{L,i=1}$ is a fundamental frequency of a standing wave in a direction L;
L is a distance between the fan module and the hard disk device;
B is a number of blades of the fan module;
N is a rotational speed of the fan module; and
C is a speed of the sound wave.

7. The server chassis according to claim 1, wherein a density parameter α of the first fins and a density parameter α of the second fins satisfy the following formula:

$\alpha = 2p-1 (p=1,2,3,\ldots)$, wherein p is a positive integer for adjusting the density parameter α of the first fins and the second fins such that α is a positive odd number;
a number J of the first fins and a number J of the second fins satisfy the following formula:

$J = j*\alpha$, wherein j is a number of modalities of the sound wave in a direction W;
a distance a from the center of each of the fins to the center of each of the openings satisfies the following formula:

$$a = \frac{W}{2J},$$

wherein
W is an internal width of the main frame;
a distance b between the fins satisfies the following equation:

$$b = \frac{W}{J},$$

and
a width c of each of the fins satisfies the following formula:

$$c = \frac{(1-r)W}{J},$$

wherein
r is an opening rate of each of the plate bodies.

8. The server chassis according to claim 1, wherein a width e of each of the openings satisfies the following formula:

$$e = a - \frac{c}{2},$$

wherein
- a is a distance from the center of each of the fins to the center of each of the openings; and
- c is a width of each of the fins; and
- a thickness t of the flow-guiding device satisfies the following formula:

$t \geq (b-c)/2 = rW/2J$, wherein

- b is a distance between the fins of the same plate body;
- r is an opening rate of each of the plate bodies;
- J are number of the first fins and number of the second fins respectively;
- W is an internal width of the main frame.

9. The server chassis according to claim 1, wherein the spacing between the first plate body and the second plate body is about 0.5 cm to 2 cm.

10. The server chassis according to claim 1, wherein a height of the first opening is about 80% to 90% of a height of the first plate body, and a height of the second opening is about 80% to 90% of a height of the second plate body.

11. A flow-guiding device, comprising:
- a first plate body comprising a plurality of first openings; and
- a second plate body, wherein the first plate body and the second plate body are parallel to each other and are spaced apart from each other by a spacing, the second plate body comprises a plurality of second openings, and the first openings are arranged alternately with the second openings;
- wherein the first plate body further comprises a plurality of first fins located between the first openings, and the second plate body further comprises a plurality of second fins located between the second openings;
- a width of each of the first openings is substantially equal to that of each of the second fins, and a width of each of the second openings is substantially equal to that of each of the first fins.

12. The flow-guiding device according to claim 11, wherein a center of one of the first openings corresponds to a center of one of the second fins, and a center of one of the first fins corresponds to a center of one of the second openings.

13. The flow-guiding device according to claim 11, further comprising a border and a sound-absorbing element located on the border.

14. The flow-guiding device according to claim 11, wherein the first plate body further comprises a first connecting portion, the second plate body further comprises a second connecting portion, the first connecting portion and the second connecting portion connect the first plate body to the second plate body and space the first plate body apart from the second plate body by the spacing.

15. The flow-guiding device according to claim 11, wherein the spacing between the first plate body and the second plate body is about 0.5 cm to 2 cm.

16. The flow-guiding device according to claim 11, wherein a height of the first opening is about 80% to 90% of a height of the first plate body, and a height of the second opening is about 80% to 90% of a height of the second plate body.

* * * * *